United States Patent [19]
Slupek et al.

[11] Patent Number: 6,069,323
[45] Date of Patent: *May 30, 2000

[54] PAD WITH INDENTATIONS SURFACE MOUNT

[75] Inventors: Darrell J. Slupek, Austin; Becky J. Clowers, Round Rock, both of Tex.

[73] Assignee: Dell USA, L.P., Round Rock, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/786,159

[22] Filed: Jan. 21, 1997

[51] Int. Cl.[7] ............................................. H05K 1/16
[52] U.S. Cl. ............................... 174/260; 361/767
[58] Field of Search ........................... 174/68.1, 250, 174/261, 26; 361/760, 767, 768, 771, 777, 782, 783

[56] References Cited

U.S. PATENT DOCUMENTS

| | | | |
|---|---|---|---|
| 2,758,256 | 8/1956 | Eisler | 361/777 |
| 2,850,681 | 9/1958 | Horton | 361/774 |
| 3,096,466 | 7/1963 | Gossard | 361/763 |
| 3,519,890 | 7/1970 | Ashby | 361/776 |
| 3,697,668 | 10/1972 | Campbell | 327/525 |
| 4,980,802 | 12/1990 | Champagne et al. | 361/764 |
| 5,401,910 | 3/1995 | Mandai et al. | 174/250 |
| 5,426,266 | 6/1995 | Brown et al. | 174/267 |
| 5,598,867 | 2/1997 | Greenwood et al. | 228/174 |

*Primary Examiner*—Hyung-Sub Sough
*Assistant Examiner*—Kamand Cuneo
*Attorney, Agent, or Firm*—Skjerven, Morrill, MacPherson, Franklin & Friel, L.L.P.; William W. Holloway

[57] ABSTRACT

A surface mount pad and a component to be soldered onto the pad includes a main portion and two extension portions coupled to the main portion. The surface mount pad has an indentation which is defined by the extension portions. The portions extend from the main portion on opposing sides of the indentation. The extension portions are positioned to extend from underneath the component lead. The indentation extends underneath the component lead.

19 Claims, 4 Drawing Sheets

PAD WITH INDENTATIONS SURFACE MOUNT

BACKGROUND OF THE INVENTION

1. Field of the Invention

The present invention relates to printed circuit board assemblies, and, more particularly, to mounting components to printed circuit boards.

2. Description of the Related Art

Printed circuit boards (PCBs) are a widely used component in all types of electronic devices. For example, PCBs are commonly used as motherboards or system boards for computer systems, especially personal computer systems. PCBs eliminate the need for a chassis containing tangled wire connections and are relatively easy and inexpensive to manufacture, install, and use. As a result, complex electronic equipment such as personal computer systems can be made less expensively and much more compactly.

PCBs generally include a board constructed from an insulating material such as a glass fiber reinforced epoxy resin. The board can be rigid or it can be relatively flexible. A plurality of electrically conductive circuitry tracks are formed onto the board by printing techniques. These tracks are then connected to various electrical components when the components are affixed to the PCB to provide a printed circuit board assembly (PCBA). The term PCB is often used to include the entire PCBA.

Components are increasingly being affixed to PCBs by the use of surface mount technology (SMT) as opposed to through-hole packaged-component technology. In through-hole mounting, a component lead is inserted into a hole on a PCB and soldered into place. SMT, on the other hand, terminates packaged circuit components in a planer manner on the surface of the PCB.

The use of SMT permits relatively smaller component packages to be mounted to PCBs. Also, SMT does not usually require component mounting holes in the interconnecting substrates (i.e., PCBs). Consequently, smaller assemblies and ultimately smaller equipment may be achieved through increased component placement densities, finer-pitch component terminals, and the ability to have components mounted on both sides of the assembly. Further, SMT provides improved shock and vibration environmental stability through the use of smaller (lower mass) component packages.

Conductive pads are typically used to connect components to the PCB. Each pad is usually rectangular in shape and sized in relation to the particular lead which is to be soldered to it. Three-lead surface mount discretes typically include a larger lead that covers a large area underneath the body of the component. (Exemplary three-lead surface mount discretes include the DPAK, TO-252 or CASE 369A-10 industry standard package and the larger D2PAK (or D²PAK), TO-263 or CASE 418B-01 industry standard packages.) The larger lead on the three-lead surface mount discretes serves both functionality and structural purposes. Pads for a three-lead SMT discrete can also be large relative to the size of the component. The size of the surface area of the component lead coming into contact with the PCB dictates the size of the pad used. Relatively large pads can cause the component to slide or skew on the pad due to solder buildup. This can cause component collisions on high density PCBs as well as a less than optimal solder joint.

Referring to FIG. 1, a portion of PCB 100 is shown. PCB 100 includes SMT pads 110, 120 and 130. Pad 110 is a rectangular pad having a horizontal width of approximately 420 mils (i.e., 0.42 inches) and a vertical length of approximately 348 mils, as oriented in FIG. 1. Pads 120 and 130 are approximately 46 mils by 135 mils. Pads 120 and 130 are approximately 180 mils from the edge of pad 110. Pads 110, 120, 130 are used to solder the leads of a component to PCB 100.

Referring to FIG. 2, a portion of PCB 100 is shown with component 200 soldered onto PCB 100. In this embodiment, component 200 is a D2PAK component. Component 200 includes side leads 210 and 220 which are soldered to pads 120 and 130, respectively. Component 200 further includes base lead 230. Base lead 230 protrudes approximately 50 mils from the upper edge of the body of component 200. Base lead 230 is soldered to pad 310.

As shown in FIG. 2, component 200 is a three-lead, surface-mount discrete which is exemplary of surface mounted components. Other types of surface mounted components are mounted to PCB 100 using analogous pads and leads.

To mount component 200 to PCB 100, solder paste is placed on pads 110, 120 and 130. The component is placed on the solder paste. Heat is applied to melt the solder paste. Component 200 floats on a thin bed of melted solder. Solder builds up at the edges of the leads, e.g., where the edge of base lead 230 meets pad 110 and at the edges of leads 210 and 200. When the solder cools, it solidifies and binds lead 230 to pad 110 and leads 210 and 220 to pads 120 and 130, respectively. Where the solder was built-up, a solder joint, or fillet, is formed. Component 200 is mounted to the surface of PCB 100 by solder fillets binding leads 210, 220, 230 to pads 120, 130, 100, respectively.

When the solder is solidifying, it contracts and pulls the component. There is a strong pull in the upper direction (as the component is oriented in FIG. 2) because there is a long (component 200 body length) solder fillet pulling in that direction. A solder fillet exists all along the edge of lead 230, pulling component 200, and therefore leads 210 and 220, away from pads 120 and 130. Component 200 can be skewed toward the edge of lead 230.

When component 200 is skewed to a side, the contact between leads 210, 220, 230 and pads 120, 130, 110 may not be as effective as desired. Also, if component 200 can be skewed to a side, it could collide with other components placed a certain distance away from component 200.

SUMMARY OF THE INVENTION

It has been discovered that by providing a copper pad with indentations at an edge of a component, solder pull towards that edge of the component can be lessened. This configuration provides the advantage that the component is centered more effectively on the pad because its placement is not skewed by the pull of a solidifying, edge-length, solder fillet. Further, solder build-up is reduced due to the lessened area of the pad, further reducing component skew. When component skew is reduced, higher component densities are possible on PCBs.

In one embodiment of the invention, a surface mount pad for receiving a component to be soldered onto the pad includes a main portion and extension portions coupled to the main portion. The surface mount pad has an indentation which is defined by the extension portions. The portions extend from the main portion on opposing sides of the indentation. The extension portions are positioned to extend from underneath the component lead. The indentation extends underneath the component lead. Each of the extension portions has a width less than a width of the component lead.

In another embodiment, a computer system includes a printed circuit board and a component surface mounted on the printed circuit board. The component has a lead mounted to a surface mount pad. The surface mount pad is coupled to the surface of the printed circuit board. The surface mount pad includes a main portion with an indentation. The main portion is for being soldered to the lead. The indentation is for preventing a lead-wide solder fillet from forming at an edge of the lead of the component.

In another embodiment, a method of surface mounting a component on a board includes providing a pad which is shaped to reduce fillet-pull skew. The pad is coupled to a surface of the board. The method further includes providing a component having a lead which is soldered to the pad. Solder fillets are formed on the pad at an edge of the lead.

In another embodiment, a method for fabricating a printed circuit board apparatus for use in a computer system includes providing a printed circuit board substrate structure with a series of transmission lines formed in the substrate structure.

The method further includes providing a surface mount pad on the substrate structure. The surface mount pad is shaped to decrease solder fillet pull. The method further includes providing a surface mount component with a lead soldered on the surface mount pad.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The following sets forth a detailed description of the preferred embodiments. The description is intended to be illustrative of the invention and should not be taken to be limiting. Many variations, modifications, additions, and improvements may fall within the scope of the invention as defined in the claims that follow.

Figure 3:
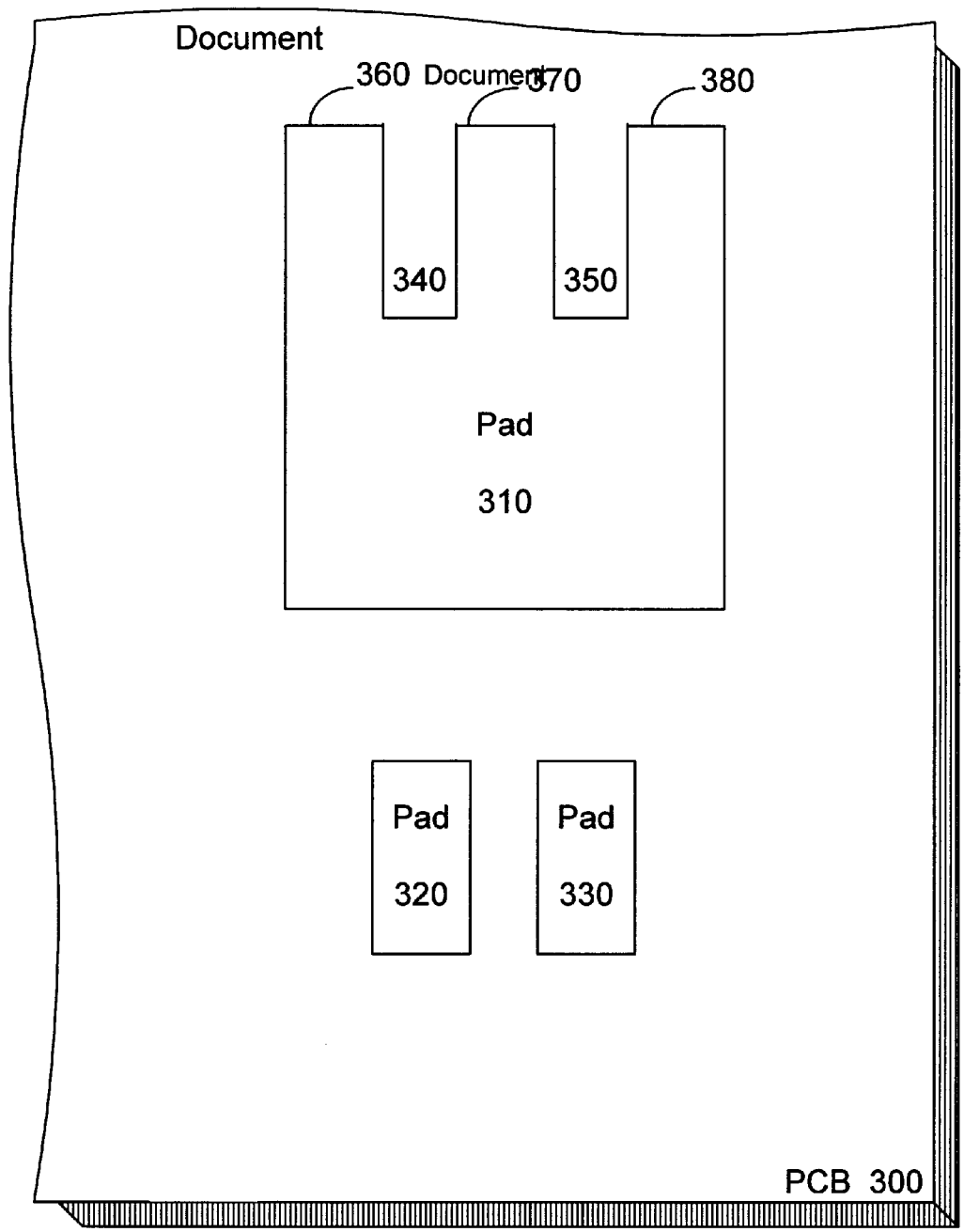
FIG. 3, shows a surface mount pad according to an embodiment of the present invention.

Referring to FIG. 3, a portion of PCB 300 is shown in accordance with an embodiment of the present invention. PCB 300 includes pad 310, pad 320 and pad 330. In the preferred embodiment, pad 310 is a copper pad having a horizontal width of approximately 420 mils and a vertical length of approximately 348 mils, as oriented in FIG. 3. Pad 310 has indentations 340 and 350 defined by extensions 360, 370 and 380. In the preferred embodiment, indentations are each approximately 84 mils wide and 116 mils deep. Indentations 340 and 350 are separated by a distance of approximately 84 mils both from the edge of pad 310 and from each other. Pads 320 and 330 are approximately 46 mils by 135 mils. Pads 320 and 330 are approximately 180 mils from the edge of pad 310. Pads 310, 320 and 330 are used to solder the leads of a component to PCB 300.

Figure 4:
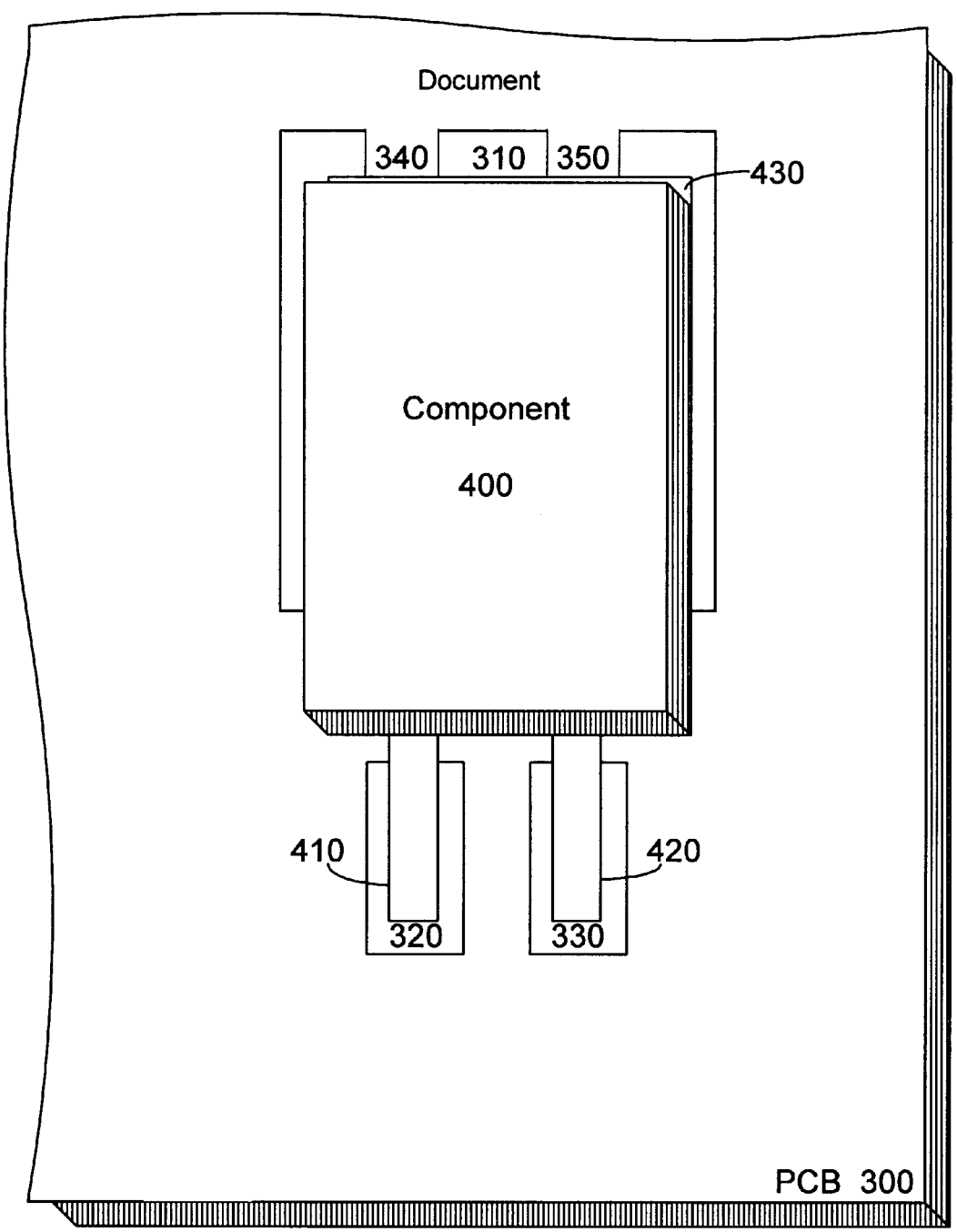
FIG. 4 shows a component affixed to a surface mount pad according to an embodiment of the present invention.

Referring to FIG. 4, a portion of PCB 300 is shown with component 400 soldered onto pad 310. Component 400 includes side leads 410, 420 and base lead 430. Side leads 410 and 420 are soldered to pads 320 and 330, respectively. Base lead 430 is soldered to pad 310. Base lead 430 protrudes approximately 50 mils from the upper edge (as oriented in FIG. 4) of the body of component 400.

To mount component 400 to PCB 300, solder paste is placed on pads 310, 320 and 330. Component 400 is placed on the solder paste. Heat is applied to melt the solder paste. Component 400 floats on a thin bed of solder supported by the surface tension of the solder. Solder builds up where the edge of base lead 430 meets pad 310. Solder also builds up at the edges of leads 410 and 420. When the solder cools, it solidifies and binds lead 430 to pad 310 and leads 410 and 420 to pads 320 and 330, respectively. Where the solder was built-up, a solder joint, or fillet, is formed. In this way, component 200 is mounted to the surface of PCB 300 by solder fillets binding leads 410, 420, 430 to pads 320, 330, 310, respectively.

Figure 1:
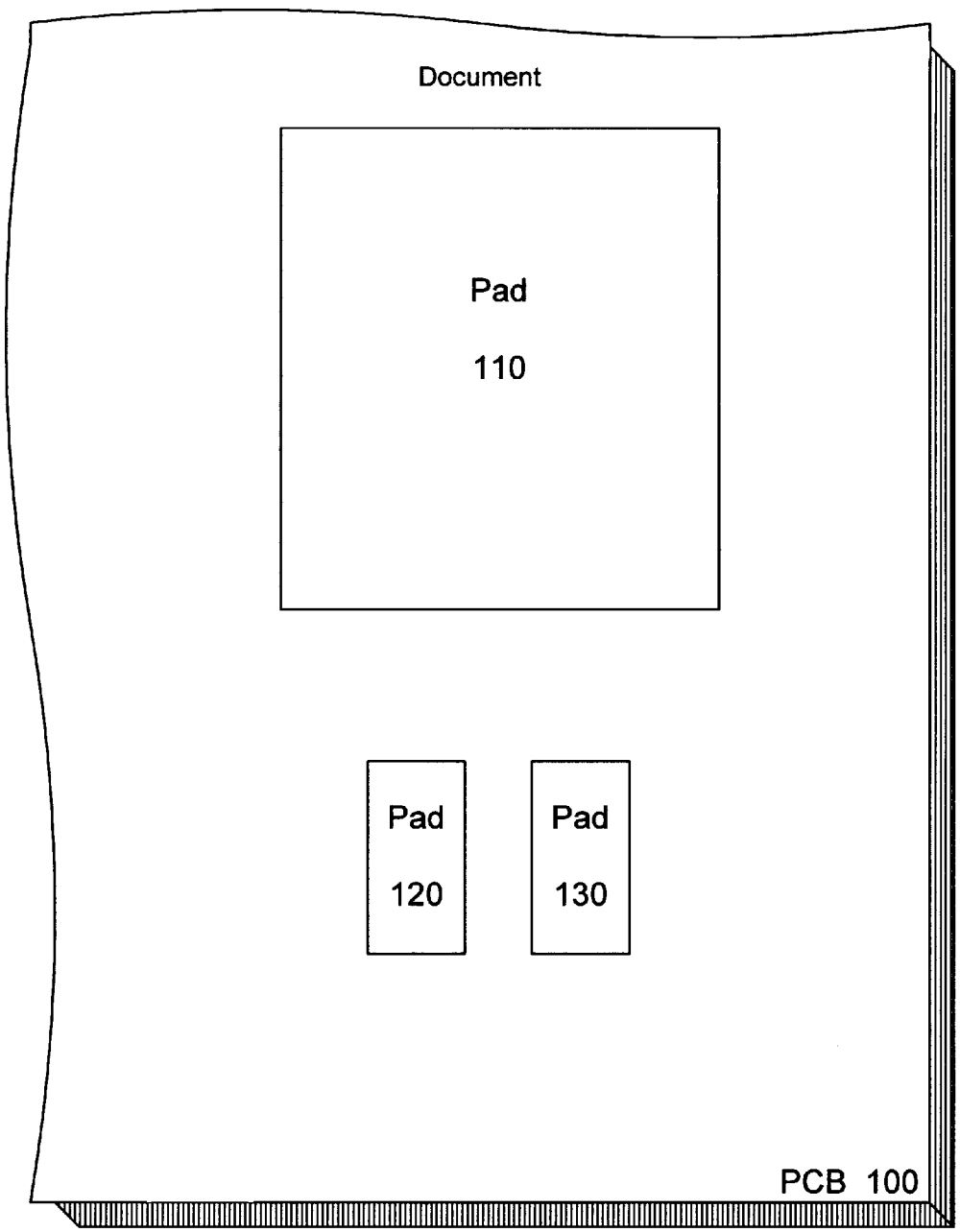
FIG. 1, labeled prior art, shows a pad according to the prior art.
Figure 2:
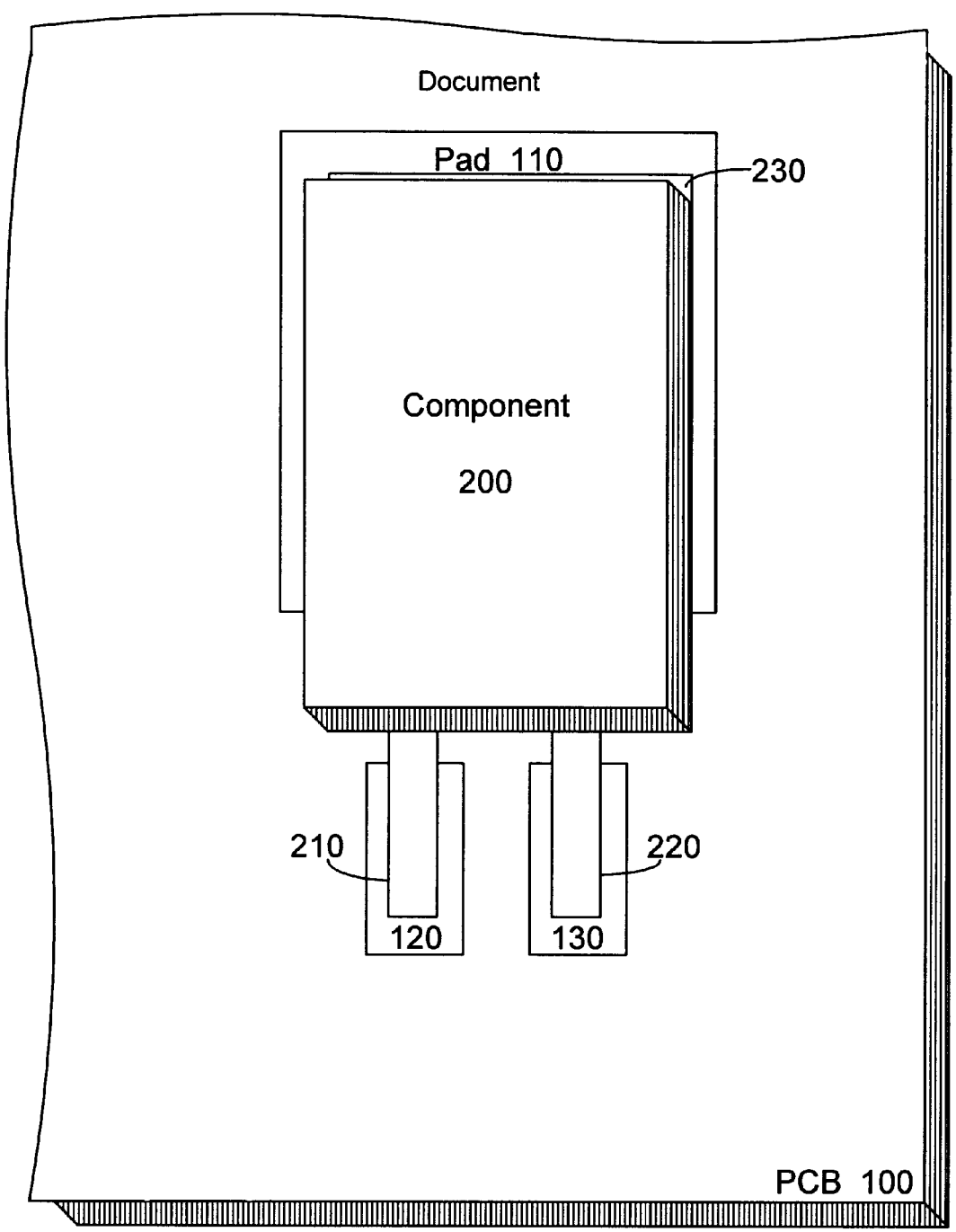
FIG. 2, labeled prior art, shows a component affixed to a pad according to the prior art.

As mentioned, when the solder fillets are solidifying, they contract and pull the component. There is a strong pull in a direction where the component has a long edge of a lead contacting the pad. Component 200 has more lead edge area abutting the solder at the top than at the bottom (as oriented in FIG. 2). Therefore, the solder tends to pull component 200 towards the top of FIG. 2. However, there is no body-length fillet to pull component 400 away from pads 320 and 330 because pad 310 has indentations 340 and 350 in the preferred embodiment. By shaping the copper pad in the shape of an "E," the pulling of component 400 is lessened because there is less component lead area abutting the solder. Because the pull to one side is reduced, the chance that the component will be skewed to one side is reduced. Therefore, the contact between the leads of component 400 and pads 310, 320, 330 are more likely to be as effective as desired. Also, if certain manufacturers place other components a certain distance away from component 400 to compensate for potential skew of component 400 and the other components, the present invention reduces the distance required between potentially skewable components, thereby increasing component density on the PCB. Thus, in the preferred embodiment, component 400 is centered more effectively on pad 310 by the formation of three smaller fillets instead of one long fillet.

Pad 310 is an exemplary pad according to an embodiment of the present invention. In the preferred embodiment, pad 310 is an E-shaped, copper pad providing a base for a component to be soldered onto PCB 300. Other shapes of pad 310 in accordance with the present invention will be apparent to those skilled in the art. For example, pad 310 could have more or less indentations. Also, component 400 is a three-lead, surface-mount discrete which is exemplary of components that may be surface mounted using pads exemplary of the present invention. Other types of surface mounted components may be mounted to PCB 300 using pads according to the present invention.

Thus, the advantage is provided that the contact between leads 410, 420 and pads 320, 330 remains substantially undisturbed by solder fillet pull. Also, if the skew of component 400 is limited, other components may be placed closer to component 400, thereby allowing more components to be placed on PCB 300. Additionally, reducing the amount of the surface area of the pad reduces the amount of solder required. By reducing the amount of the solder, component 400 is less likely to skew by floating on the solder during placement on PCB 300.

While the invention has been described with reference to various embodiments, it will be understood that these embodiments are illustrative and that the scope of the invention is not limited to them. Many variations, modifications, additions, and improvements of the embodiments described are possible. Those skilled in the art will recognize that alternative embodiments may be implemented in agreement with the present invention.

For example, the use of the shape of the letter "E" in the preferred embodiment is illustrative. Other configurations of indentations and extensions may be used to reduce the skewing fillet pull in one or more directions.

Furthermore, the materials and techniques described herein are merely illustrative and a variety of additional and/or alternative materials and techniques may be analogously provided in accordance with the present invention. For example, although the preferred embodiment utilizes three-lead surface mount discretes, other surface mounted components may be used, such as any SMT discrete packages which have a larger lead on one side and two or more leads on the opposite side, or any component which has a lead or leads that have a large surface area in relation to the area or size of the component can be surface mounted in accordance with the invention. The above mentioned SMT packages are exemplary, and other SMT packages may be used in accordance with the invention. Also, although the pad in the preferred embodiment is copper, it is appreciated that other materials may be used. Additionally, the soldering techniques discussed herein are merely illustrative, and other soldering techniques may be used in accordance with the invention.

The measurements contained herein are merely approximate measurements used to describe the preferred embodiment. For example, it has been stated that base leads 230 and 430 protrude approximately 50 mils from the edge of the body of components 200 and 400, respectively. This measurement includes a nominal range of 37–87 mils, and a protrusion greater than 37 mils and lesser than 87 mils is in accordance with the invention. Further, the measurements contained herein refer to the D2PAK component. Other measurements may apply to other embodiments of the invention.

These and other variations, modifications, additions, and improvements may fall within the scope of the invention as defined in the claims which follow.

What is claimed is:

1. A plurality of surface mount pads on a circuit board receiving a component having a first lead forming a bottom surface portion and extending from one end of the component, the component having at least two second leads forming bottom surface portions of the component and extending from an opposite end of the component, each of the second leads being smaller than the first lead, the component to be soldered onto the surface mount pads, the surface mount pads comprising:

a first surface mount pad for contacting the first lead, the first surface mount pad including:
a main portion;
a first extension portion extending from the main portion; and
a second extension portion extending from the main portion and unconnected with the first extension portion; and at least two second surface mount pads for contacting the at least two second leads, each of the second surface mount pads being smaller that the first surface mount pad;

wherein the surface mount pads are positioned with the second leads in contact with the second surface mount pads, the first lead being in contact with the main portion and with the first and second extension portions, the first and second extension portions extending beyond the edge of the first lead at the one end of the component.

2. The surface mount pads of claim 1 wherein the surface mount pads are conductive.

3. The surface mount pads of claim 2 wherein the surface mount pads are copper.

4. The surface mount pads of claim 1 wherein:
the first surface mount pad includes a plurality of indentations, the plurality of indentations being defined by a plurality of extension portions including the first and second extension portions and at least one additional extension portion extending from the main portion;
each of the plurality of indentations are defined by two of the plurality of extension portions;
each of the plurality of extension portions including a contact portion to which the component is soldered and a non-contact portion extending beyond the component; and
the plurality of indentations extending underneath the component.

5. The first surface mount pad of claim 4 wherein the plurality of extension portions includes a first number of extension portions and the plurality of indentations includes a second number of indentations, the second number of indentations being one less than the first number of extension portions.

6. The first surface mount pad of claim 4 wherein:
the plurality of extension portions includes three extension portions; and
the plurality of indentations includes two indentations.

7. The first surface mount pad of claim 6 wherein the three extension portions are parallel to define an "E" shape with the main portion.

8. A system comprising:
a printed circuit board;
a plurality of surface mount pads attached to a surface of the printed circuit board, the plurality of surface mount pads including:
a first surface mount pad having, a main portion, and a first plurality of extension portions extending from the main portion, and
a second plurality of second surface mount pads, the second surface mout pads being smaller than the first surface mount pad; and
a component soldered to the plurality of surface mount pads, the component including:
a first lead on the bottom surface soldered to the first surface mount pad, wherein the first plurality of extension portions extend beyond the first lead at a first end of the component;
a second plurality of second leads extending from an opposite end of the component, the second plurality of leads soldered to the second plurality of small surface mount pads.

9. The system of claim 8 wherein the component is a three-lead surface-mount discrete.

10. The system of claim 8 wherein the component is a DPAK.

11. The system of claim 8 wherein the component is a D2PAK.

12. The system of claim 8 wherein the indentation reduces a force resulting from the solder fillet.

13. Apparatus having a component mounted thereon, the component having a first lead on a portion of the bottom surface extending from one end of the component, the component having a plurality of second leads extending from an opposite end of the component, the apparatus comprising:

a printed circuit board;

a first surface mount pad on the surface of the circuit board, the first surface mount pads including:
  a main portion;
  a first extension portion extending from the main portion; and
  a second extension portion extending from the main portion; and a plurality of second surface mount pads on a surface of the printed circuit board;
  wherein the plurality of second leads is mounted on the plurality of second surface mount pads, the first lead in mounted on the first surface mount pad, the first and the second extension portions extending beyond the first lead at the one end of the component.

14. The apparatus of claim 13 further comprising:

the component soldered onto the surface mounted pads.

15. The apparatus of claim 14 wherein the component is a surface-mount discrete component.

16. The apparatus of claim 14 wherein the component is a DPAK package.

17. The apparatus of claim 14 wherein the component is a D2PAK package.

18. The the apparatus of claim 13, the first surface mount pad further including:

a plurality of extension portions including the first and second extension portions and at least one additional extension portion coupled to the main portion; and a plurality of indentations including the first indentation, each of the plurality of indentations being defined by two of the plurality of extension portions extending from the main portion on opposing sides of the each of the plurality of indentations; and wherein each of the plurality of extension portions are positioned to extend from underneath the first lead with the first and second leads being soldered to the first and second surface mount pads; and each of the plurality of indentations are positioned to extend underneath the first lead with the first and second leads being soldered to the first and second surface mount pads.

19. The apparatus of claim 18 wherein the large surface mount pad includes:

three parallel extension portions; and two indentations.

\* \* \* \* \*

UNITED STATES PATENT AND TRADEMARK OFFICE
CERTIFICATE OF CORRECTION

PATENT NO. : 6,069,323
DATED : May 30, 2000
INVENTOR(S) : Darrell J. Slupek, Becky J. Clowers Page 1 of 1

It is certified that error appears in the above-identified patent and that said Letters Patent is hereby corrected as shown below:

<u>Title page, Item [56],</u>
References Cited, delete "5,598,867" and insert -- 5,598,967 --.

<u>Column 5,</u>
Line 66, delete "that" and insert -- than --; and

<u>Column 7,</u>
Line 11, delete "first" and insert -- large --.

Signed and Sealed this

Fourth Day of December, 2001

Attest:

*Nicholas P. Godici*

Attesting Officer

NICHOLAS P. GODICI
*Acting Director of the United States Patent and Trademark Office*